United States Patent
Law et al.

(10) Patent No.: US 10,312,214 B2
(45) Date of Patent: Jun. 4, 2019

(54) ATOMIZATION MECHANISM FOR COOLING A BOND HEAD

(71) Applicant: ASM Technology Singapore Pte. Ltd., Singapore (SG)

(72) Inventors: Yi Kei Law, Kwai Chung (HK); Chuek Wah Tang, Kwai Chung (HK); Pak Kin Leung, Kwai Chung (HK); Gary Peter Widdowson, Hong Kong (HK); Wing Chiu Lai, Tuen Mun (HK); Kin Fung Yu, Hong Kong (HK); Jiang Wen Deng, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 323 days.

(21) Appl. No.: 15/259,789

(22) Filed: Sep. 8, 2016

(65) Prior Publication Data

US 2018/0068973 A1 Mar. 8, 2018

(51) Int. Cl.
| | |
|---|---|
| *B23K 3/00* | (2006.01) |
| *H01L 23/00* | (2006.01) |
| *B05B 12/08* | (2006.01) |
| *B05B 7/04* | (2006.01) |
| *B23K 3/04* | (2006.01) |
| *B23K 3/08* | (2006.01) |
| *B23K 1/00* | (2006.01) |
| *B23K 1/20* | (2006.01) |
| *B23K 101/42* | (2006.01) |

(52) U.S. Cl.
CPC ............ *H01L 24/75* (2013.01); *B05B 7/0416* (2013.01); *B05B 12/087* (2013.01); *B23K 1/0016* (2013.01); *B23K 1/20* (2013.01); *B23K 3/04* (2013.01); *B23K 3/085* (2013.01); *B23K 2101/42* (2018.08); *H01L 2224/75502* (2013.01)

(58) Field of Classification Search
CPC .............................. B05B 12/087; B23K 3/085
See application file for complete search history.

(56) References Cited

U.S. PATENT DOCUMENTS

| | | | |
|---|---|---|---|
| 2006/0023424 A1* | 2/2006 | Nakamura | ......... G01R 31/2875 361/699 |
| 2014/0367898 A1* | 12/2014 | Hebert | ................ C21D 9/0025 266/44 |
| 2016/0116217 A1 | 4/2016 | Law et al. | |

* cited by examiner

*Primary Examiner* — Erin B Saad
(74) *Attorney, Agent, or Firm* — Ostrolenk Faber LLP

(57) ABSTRACT

An atomization mechanism for cooling a bond head comprises an atomization module and a conduit. In use, the atomization module receives gas and liquid from a gas supply and a liquid supply respectively to form an atomized spray and the conduit conveys the atomized spray from the atomization module to a spray inlet located at the bond head to receive the atomized spray into the bond head for cooling the bond head.

18 Claims, 8 Drawing Sheets

ATOMIZATION MECHANISM FOR COOLING A BOND HEAD

FIELD OF THE INVENTION

Figure 1:
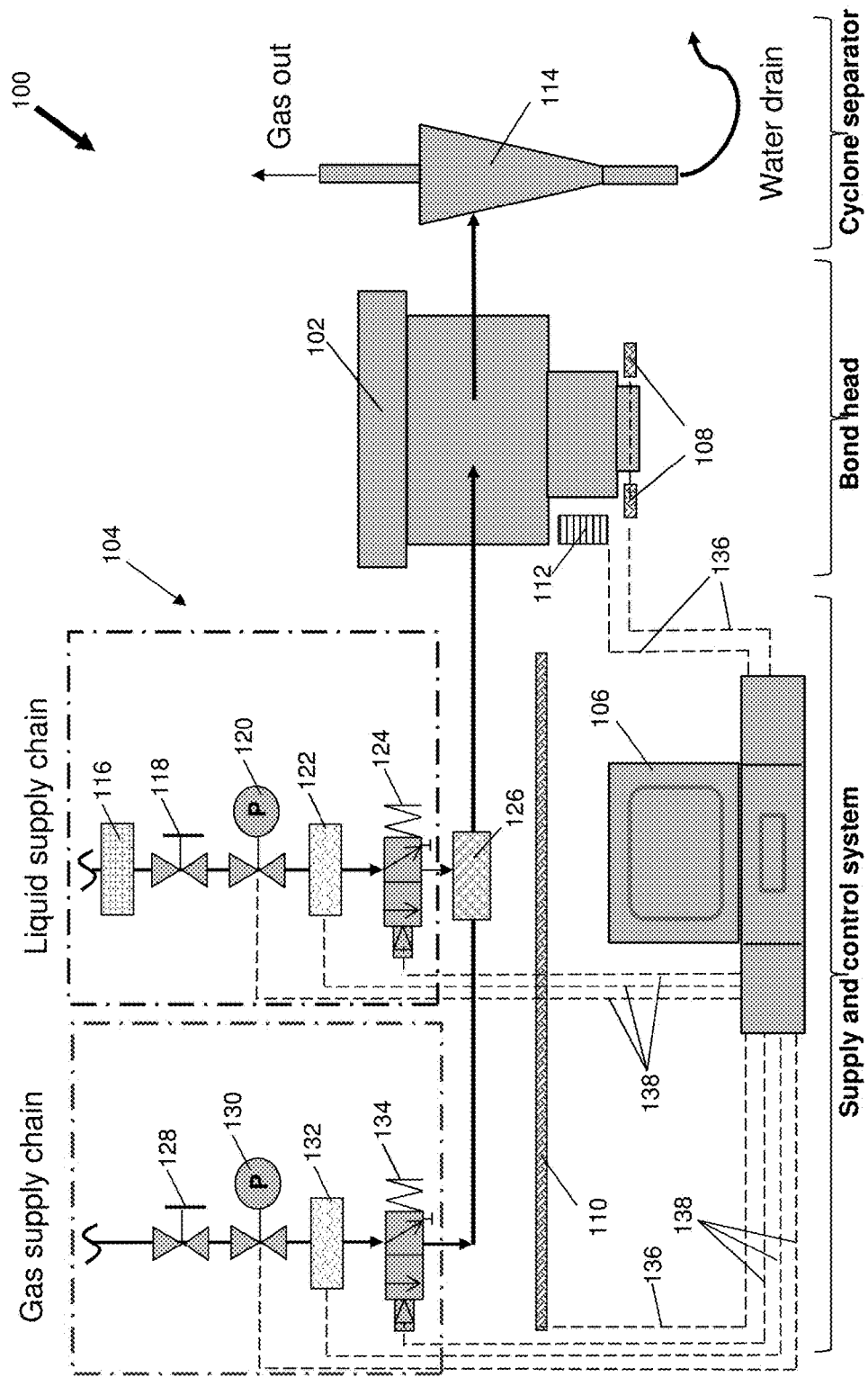
Figure 2:
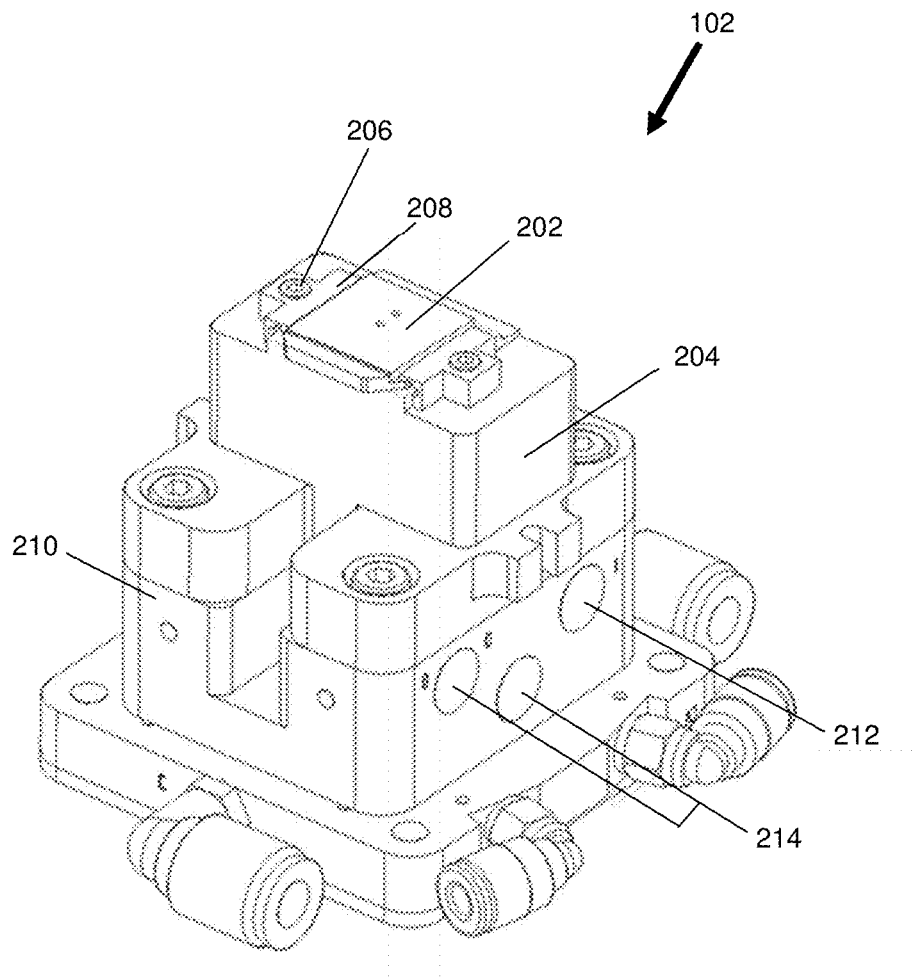
Figure 3A:
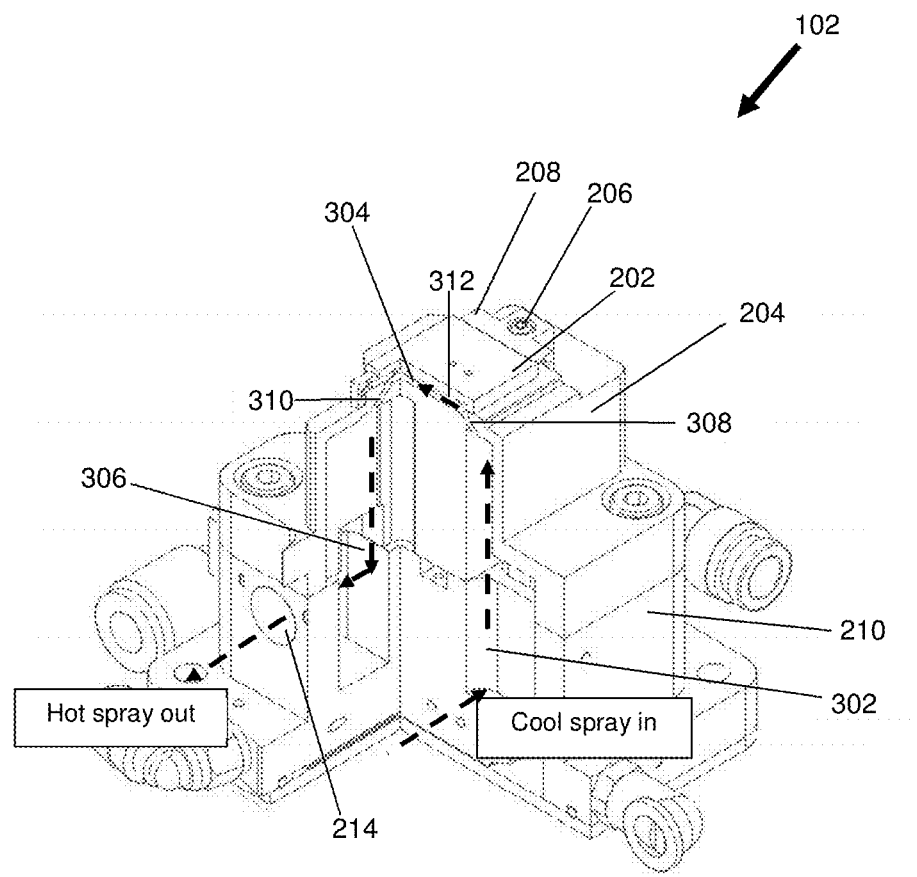
Figure 3B:
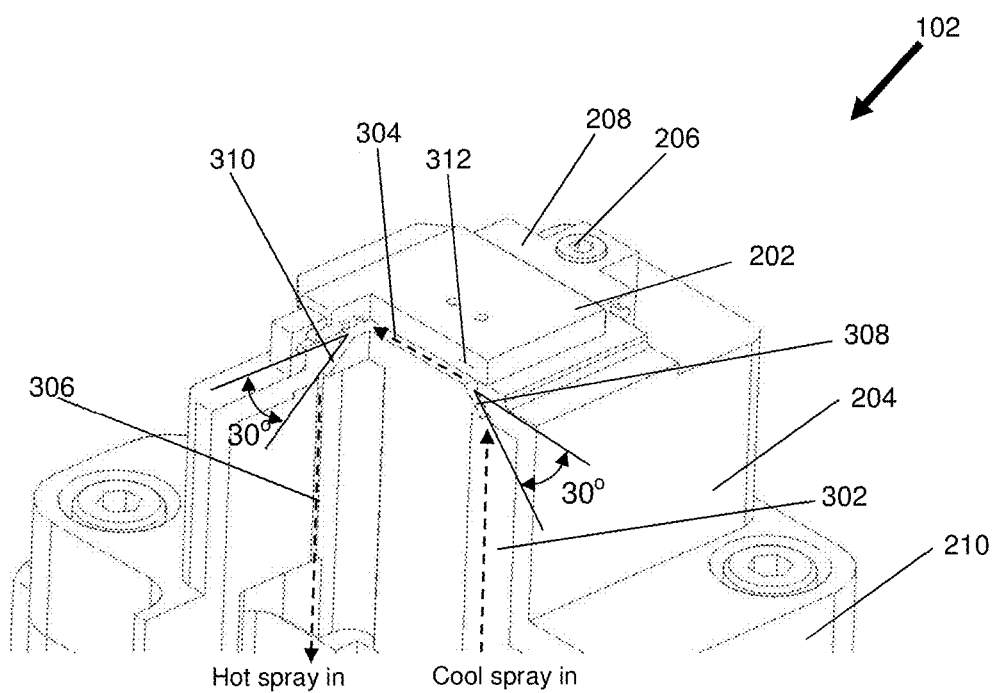
Figure 4:
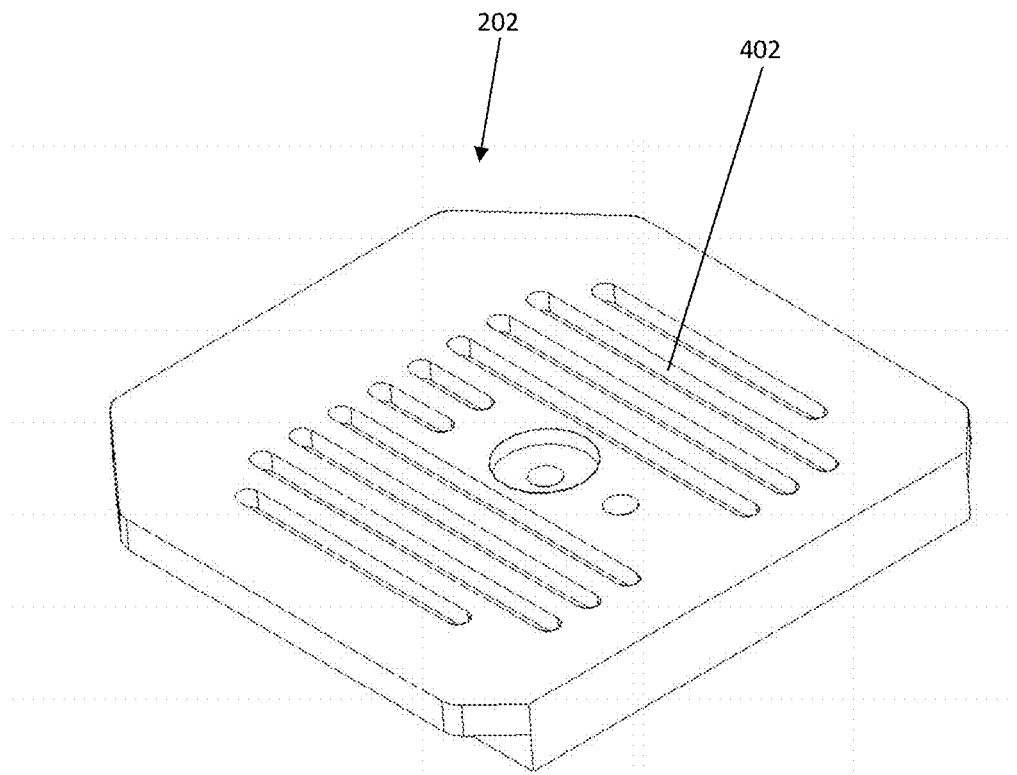

The present invention relates to an atomization mechanism for cooling a bond head and a bonding apparatus comprising such atomization mechanism.

BACKGROUND OF THE INVENTION

One of the modules in a bonding machine for electronic devices, such as a die bonding machine, is the bond head. During a bonding process, an electronic device is first placed onto a collet of the bond head. The collet is then heated to about 350 degrees Celsius using a heater assembled in the bond head. Such heating melts the solder balls attached with the electronic device and while the solder balls are melted, the electronic device is urged against a bonding site, such as a substrate, with a predetermined force. As a result, the electronic device is bonded with the substrate via the melted solder balls. To strengthen this bond, the solder balls are cooled so that they can solidify and harden. It is beneficial to heat and cool the solder balls as quickly as possible so as to increase bond quality and productivity.

Conventional methods of increasing the heating rate include pulse heating, whereas conventional methods of increasing the cooling rate include actively cooling the bond head heater by blowing compressed gas or passing liquid through cooling channels inside the bond head. However, even with such active cooling of the bond head heater, the cooling rate remains unsatisfactory.

To further increase the cooling rate of the solder balls, US Patent Publication Number 2016/0116217A1 describes a bond head having a plurality of spray nozzles inside it. More specifically, the spray nozzles are positioned below the heater of the bond head. To cool the heater, a water spray is generated and is directed at the bottom surface of the heater via each of the spray nozzles. However, it is difficult to install the spray nozzles in bond heads which are small in size and which have small heaters (e.g. heaters which are less than 16 mm×16 mm in size). Therefore, the bond head has to be relatively large in order to accommodate the spray nozzles. Further, due to the tiny openings of the spray nozzles, the amount of water spray that can be generated and directed at the heater is limited.

SUMMARY OF THE INVENTION

The present invention aims to provide a new and useful atomization mechanism for cooling a bond head.

In general terms, the present invention proposes an atomization mechanism having an atomization module operative to form an atomized spray and a conduit configured to convey this atomized spray to the bond head to cool the bond head.

Specifically, a first aspect of the present invention is an atomization mechanism for cooling a bond head, the atomization mechanism comprising: an atomization module configured to receive gas and liquid from a gas supply and a liquid supply respectively to form an atomized spray; and a conduit configured to convey the atomized spray from the atomization module to a spray inlet located at the bond head to receive the atomized spray into the bond head.

Using an atomized spray to cool the bond head increases the rate of cooling the bond head. This in turn increases the productivity (as measured in units processed per hour) of the bonding machine. By having the atomization module (in which the atomized spray is formed) outside the bond head, the atomization module can be used with more compact bond heads with smaller heaters, and the overall bonding apparatus can be more compact. The flow rate of the atomized spray can also be more easily controlled.

The atomization mechanism may further comprise a liquid pressure regulator operative to adjust a pressure of the liquid supply to the atomization module. This allows the control of the liquid supply flow rate to the atomization module.

The atomization mechanism may further comprise a gas pressure regulator operative to adjust a pressure of the gas supply to the atomization module. Similarly, this allows the control of the gas supply flow rate to the atomization module.

The atomization mechanism may further comprise a gas measuring unit operative to measure one or both of a pressure and a flow rate of the gas supply to the atomization module. This provides feedback that can be used to adjust the gas flow to achieve a desired flow rate.

The atomization mechanism may further comprise valves which are configured to be selectively activated to control a flow of the gas supply and a flow of the liquid supply into the atomization module. This allows the initiation and stopping of the liquid spray formation in the atomization module.

A second aspect of the present invention is a bonding apparatus comprising: a bond head comprising: a holding element configured to hold an electronic device; a heater configured to heat the holding element; and a spray inlet located at the bond head and configured to receive an atomized spray into the bond head to cool the heater; and an atomization mechanism comprising: an atomization module configured to receive gas and liquid from a gas supply and a liquid supply respectively to form the atomized spray; and a conduit configured to convey the atomized spray from the atomization module to the spray inlet located at the bond head.

The bonding apparatus may further comprise a plurality of leakage sensors arranged to detect leakage of the liquid from one or both of the atomization mechanism and bond head. This allows early detection of liquid leakage around the bond head and the atomization mechanism, in turn allowing early rectification of any leakage to be conducted. In this way, the impact of the leakage on production can be reduced, and further potentially more serious damage of the atomization mechanism and bond head due to the leakage can be avoided.

The bonding apparatus may further comprise a plurality of humidity sensors arranged to determine a relative humidity around the bond head. This provides an additional feedback facilitating the early detection of liquid leakage around the bond head.

The bonding apparatus may further comprise a separating mechanism configured to receive the atomized spray from the bond head, the separating mechanism being operative to separate the atomized spray into liquid and gas respectively. This allows the atomized spray to cool down without the need for a radiator. Thus, problems associated with the radiator, such as having water droplets left in the chimney of the radiator and a high back pressure at an exhaust of the bond head can be avoided.

The separating mechanism may comprise a hollow body configured to cause the atomized spray to form a rotating spray flow. This achieves an efficient separation of the atomized spray into liquid and gas. The rotating spray flow may rotate in a helical pattern.

The separating mechanism may comprise a hollow body having a cylindrical portion coupled with a frusto-conical portion. Such a structure can be easily manufactured to cause the atomized spray to form the high speed rotating spray flow.

The bond head may further comprise a cooling channel through which the spray inlet is conveyed, the cooling channel being connected to the spray inlet and having a cooling portion in contact with the heater along a surface of the heater. Heat can thus be transferred from the surface of the heater in contact with the cooling portion to atomized spray passing through the cooling portion. In this way, the cooling rate of the heater is improved by directing the atomized spray over a greater surface area of the heater.

The cooling channel may further comprise an inclined inlet configured to direct the atomized spray into the cooling portion, the inclined inlet being inclined at an angle of between 30 to 60 degrees with respect to the cooling portion. Such inclination helps to increase the speed of flow of the atomized spray through the cooling portion by reducing the cross sectional area of the flow regime adjacent to (such as before and after) the cooling portion. This in turn increases the heat transfer coefficient between the heater and the atomized spray flowing through the cooling portion. Furthermore, by maximizing the speed of flow of the atomized spray, the chances of the spray droplets coming into contact with the heater increase. It can also further break down the water spray into small sizes and reduce the flow resistance (pressure drop) in the flow path of the atomized spray as it flows through the cooling channel. The inclination further allows the inclined inlet to hold liquid droplets remaining from a previous atomized spray flow by the force of surface tension, preventing liquid droplets from flowing through the cooling portion when the heater is heating the holding element or when no heating or cooling is to be performed.

The cooling channel may further comprise an inclined outlet configured to direct the atomized spray exiting the cooling portion, the inclined outlet being inclined at an angle of between 30 to 60 degrees with respect to the cooling portion. Similarly, this can increase the speed of flow of the atomized spray through the cooling portion, increasing the heat transfer coefficient between the heater and the atomized spray. It can also further break down the water spray into small sizes and reduce the flow resistance (pressure drop) in the flow path of the atomized spray as it flows through the cooling channel. Such inclination further allows the inclined outlet to hold liquid droplets remaining from a previous atomized spray flow by the force of surface tension.

The bonding apparatus may further comprise a heater control mechanism operative to control the atomization mechanism and a power supply to the heater based on a temperature of the heater. This allows the regulation of the heater's temperature. The heater control mechanism may be operative to initiate the formation of the atomized spray in the atomization module upon detecting a need to cool the heater. The heater control mechanism may be operative to adjust the power supply to change a heating rate of the heater based on the temperature of the heater.

A third aspect of the present invention is a bonding apparatus comprising: a bond head comprising: a holding element configured to hold an electronic device; a heater configured to heat the holding element; and an insulating element configured to reduce transmission of heat away from the heater; and an atomization mechanism configured to receive gas and liquid from a gas supply and a liquid supply respectively to form an atomized spray; wherein the atomization mechanism is external to the bond head and is operative to convey the atomized spray to the bond head for cooling the heater.

BRIEF DESCRIPTION OF THE FIGURES

An embodiment of the invention will now be illustrated for the sake of example only with reference to the following drawings, in which:

FIG. 1 is a schematic representation of a bonding apparatus according to an embodiment of the present invention;

FIG. 2 is a perspective view of a bond head of the bonding apparatus of FIG. 1;

FIG. 3(*a*) is a partial sectional view of the bond head of FIG. 2 and FIG. 3(*b*) is a partial sectional view of a top portion of the bond head;

FIG. 4 is a perspective view of a heater plate of the bonding apparatus of FIG. 1;

FIG. 5 is a sectional view of an atomization module of the bonding apparatus of FIG. 1;

FIG. 6 is a sectional view of a cyclone separator of the bonding apparatus of FIG. 1; and FIG. 7 is a schematic diagram illustrating an interaction of a heater control mechanism with an atomization mechanism and the bond head of the bonding apparatus of FIG. 1.

DETAILED DESCRIPTION OF THE EMBODIMENTS

FIG. 1 is a schematic representation of a bonding apparatus 100 according to an embodiment of the present invention.

The bonding apparatus 100 comprises a bond head 102 having a heater comprised in a heater plate (not shown in FIG. 1), an atomization mechanism 104 and a heater control mechanism 106. The heater control mechanism 106 is configured to regulate a temperature of the heater plate by controlling the heating and cooling of the heater plate. The atomization mechanism 104 is configured to provide an atomized spray in the form of a liquid spray (which is a mixture of gas and liquid) to the bond head 102 to cool the heater plate.

A first and second plurality of leakage sensors 108, 110 are provided near the bond head 102 and the atomization mechanism 104 respectively and are arranged to detect leakage of liquid from the bond head 102 and the atomization mechanism 104. A plurality of humidity sensors 112 is also provided in a vicinity of the bond head 102 to determine a relative humidity around the bond head 102. The heater control mechanism 106 is connected to the sensors 108, 110, 112 via signaling cables 136. The sensors 108, 110, 112 are configured to send signals to the heater control mechanism 106 via these signaling cables 136 to indicate the amount of liquid leakage from the bond head 102 and the atomization mechanism 104, and the relative humidity around the bond head 102. If the amount of leakage is too large or if the relative humidity around the bond head 102 is too high, it is determined that the bonding apparatus 100 is faulty. In this case, the bonding apparatus 100 is shut down for detailed checking and rectification.

The bonding apparatus 100 also comprises a separating mechanism in the form of a cyclone separator 114 connected to the bond head 102. The cyclone separator 114 is configured to receive the liquid spray from the bond head 102 and is further configured to separate the liquid spray into liquid and gas.

As shown in FIG. 1, the atomization mechanism 104 includes a liquid supply chain connected to a liquid supply and a gas supply chain connected to a compressed gas supply. The liquid supply chain and the gas supply chain are configured to provide liquid and compressed gas respectively to an atomization module 126 external to the bond head 102.

The liquid supply chain includes a liquid filter 116, a liquid pressure regulator 118, a liquid measuring unit having a liquid pressure gauge 120, a liquid flowmeter 122, and a liquid solenoid valve 124. The liquid filter 116 is connected to the liquid supply, and is configured to receive liquid from the liquid supply and to remove debris from the received liquid. The liquid pressure regulator 118 is configured to receive the filtered liquid from the liquid filter 116 and to adjust the pressure of the liquid supply to the atomization module 126. The liquid solenoid valve 124 is configured to control the flow of the liquid supply into the atomization module 126. In particular, the activation of the liquid solenoid valve 124 allows flow of the liquid into the atomization module 126 and the deactivation of the liquid solenoid valve 124 prevents flow of the liquid into the atomization module 126. The liquid pressure gauge 120 and liquid flowmeter 122 are operative to cooperate to determine the pressure and flow rate of the liquid supply to the atomization module 126 when the liquid solenoid valve 124 is activated.

Similarly, the gas supply chain comprises a gas pressure regulator 128, a gas measuring unit including a gas pressure gauge 130 and a gas flowmeter 132, and a gas solenoid valve 134. The gas pressure regulator 128 is connected to the gas supply and is configured to adjust the pressure of the gas supply to the atomization module 126. Similar to the liquid solenoid valve 124, the gas solenoid valve 134 serves to control the flow of the gas supply into the atomization module 126. Specifically, when the gas solenoid valve 134 is activated, flow of gas into the atomization module 126 is enabled. On the other hand, when the gas solenoid valve 134 is deactivated, flow of gas into the atomization module 126 is prevented. The gas pressure gauge 130 and gas flowmeter 132 are configured to determine the pressure and flow rate of the gas supply to the atomization module 126 when the gas solenoid valve 134 is activated.

Signaling cables 138 connect the gas and liquid solenoid valves 124, 134, flowmeters 122, 132 and pressure gauges 120, 130 to the heater control mechanism 106. The heater control mechanism 106 is configured to send control signals to these components to control them and to adjust their parameters.

FIG. 2 is a perspective view of the bond head 102. As shown in FIG. 2, the bond head 102 comprises the heater plate 202 at one end. A holding element in the form of a collet (not shown in FIG. 2) is connected to a top surface of the heater plate 202 and is configured to hold an electronic device, such as a semiconductor die. The heater plate 202 is configured to heat the holding element, thereby heating the electronic device.

At an opposite end from the heater plate 202, the bond head 102 comprises a base 210 that is attachable to a bond head column of a die bonding machine. The base 210 comprises a spray inlet 212 configured to receive the liquid spray from the atomization mechanism 104 into the bond head 102 to cool the heater plate 202. Two exhaust outlets 214 are provided on the base 210 of the bond head 102. The exhaust outlets 214 are configured to allow the liquid spray to exit the bond head 102. The exhaust outlets 214 are connected to the cyclone separator 114, so that the exiting liquid spray is fed into the cyclone separator 114.

The heater plate 202 is locked to an insulation element in the form of an insulation block 204 via a clamping plate 208 secured by screws 206. The insulation block 204 is positioned below the heater plate 202 and is configured to reduce transmission of heat away from the heater plate 202 (particularly, transmission of heat from the heater plate 202 to the base 210), so as to increase the heating efficiency. Sealing ceramic glue is applied to gaps between the heater plate 202 and the insulation block 204 to seal these gaps. The bond head 102 also comprises temperature sensors attached to the heater plate 202 to determine the temperature of the heater plate 202. These temperature sensors are configured to send temperature feedback to the heater control mechanism 106.

FIG. 3(*a*) is a partial sectional view of the bond head 102. As shown in FIG. 3(*a*), the spray inlet 212 leads to a cooling channel having an input portion 302, a cooling portion 304 and an output portion 306. The cooling channel further comprises an inclined inlet 308 extending from the input portion 302 to the cooling portion 304, and an inclined outlet 310 extending from the cooling portion 304 to the output portion 306. The input and output portions 302, 306 extend through the base 210 and insulation block 204, whereas the cooling portion 304 extends along a surface of the heater plate 202, allowing liquid spray passing through the cooling portion 304 to come into contact with the heater plate 202 along this surface.

FIG. 3(*b*) is a partial sectional view of a top portion of the bond head 102. As shown in FIG. 3(*b*), the inclined inlet 308 and inclined outlet 310 are inclined with respect to the cooling portion 304 at an angle of about 30 degrees. Such inclination helps to increase the speed of flow of the liquid spray through the cooling portion 304 by reducing the cross sectional area of the flow regime before and after the cooling portion 304. This in turn increases the heat transfer coefficient between the heater plate 202 and the liquid spray flowing through the cooling portion 304. Furthermore, by maximizing the speed of flow of the liquid spray, the chances of the liquid droplets coming into contact with the heater plate 202 increase, and the pressure drop (flow resistance) of the liquid spray as it enters the cooling portion 304 decreases. The inclination also allows the inclined inlet 308 and inclined outlet 310 to hold liquid droplets remaining from a previous liquid spray flow by the force of surface tension. This prevents liquid droplets from flowing through the cooling portion 304 when the heater plate 202 is heating the collet or during an idle state when no heating or cooling is to be conducted.

To enhance a cooling efficiency of the heater plate 202, the heater plate 202 further includes a plurality of fins (not shown in FIG. 3(*a*) or FIG. 3(*b*)) and is coated with a cooling layer in the form of a $TiO_2$ layer 312 on its bottom surface to reduce a film boiling effect.

FIG. 4 is a perspective view of the heater plate 202, showing the fins 402 of the heater plate 202. The fins 402 provide an increased area for heat transfer between the heater plate 202 and the liquid spray through the cooling portion 304. With the fins 402, the chances of the liquid droplets through the cooling portion 304 coming into contact with the heater plate 202 can also be increased.

FIG. 5 is a sectional view of the atomization module 126. The atomization module 126 is configured to allow the gas and liquid to mix to form the liquid spray. As shown in FIG. 5, the atomization module 126 comprises a mixing tube 502 and a conveying tube 504, and a T-joint 506 connecting the mixing and conveying tubes 502, 504. A diameter of the mixing tube 502 is narrower than a diameter of the conveying tube 504. The atomization module 126 also includes a liquid inlet 508 with one end connected to the liquid supply chain and the other end connected to the mixing tube 502. One end of the mixing tube 502 is an open end and serves as a first compressed gas inlet 510. The other end of the mixing tube 502 is connected to the T-joint 506, which is in turn connected to the conveying tube 504. The conveying tube 504 has two open ends, one serving as a second compressed gas inlet 512 and the other serving as a liquid spray outlet 514. The gas inlets 510, 512 are independently connected to the gas supply chain. The liquid spray outlet 514 is connected to a conduit, such as a tube. The conduit is in turn connected to the spray inlet 212 of the bond head 102 and is configured to convey the liquid spray 520 from the atomization module 126 to the spray inlet 212.

Figure 6:
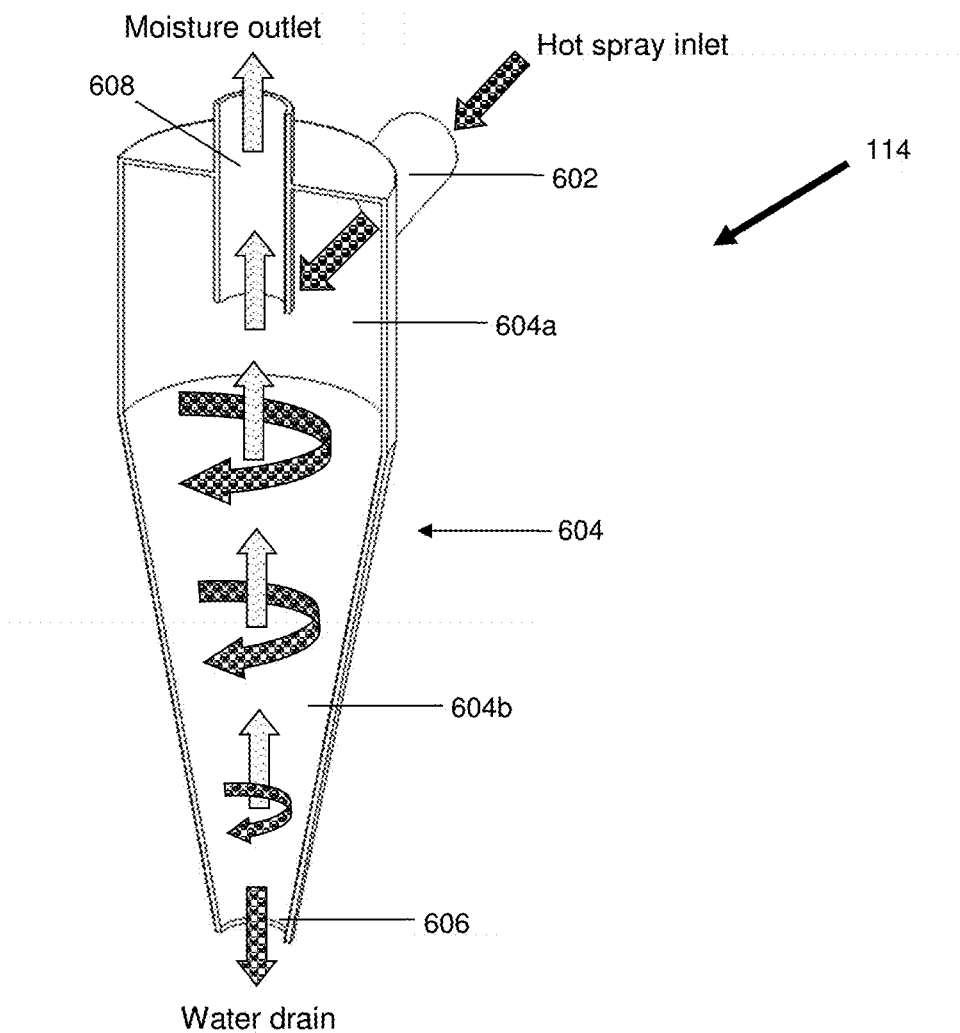

FIG. 6 is a sectional view of the cyclone separator 114. As mentioned above, the cyclone separator 114 is configured to receive the liquid spray from the bond head 102 and is further configured to separate the liquid spray into liquid and gas.

The cyclone separator 114 comprises a hollow body 604 designed to cause the liquid spray entering the cyclone separator 114 to form a high speed rotating spray flow. To elaborate, the hollow body 604 has a cylindrical portion 604a coupled with a frusto-conical portion 604b. A hot spray inlet 602 is provided on the surface of the cylindrical portion 604a to receive the liquid spray from the bond head 102. The cylindrical portion 604a includes a covered end through which a cylindrical gas outlet 606 extends to allow exit of the gas separated from the liquid spray. Opposite the covered end, the cylindrical portion 604a includes an open end coupled with a first open end of the frusto-conical portion 604b. These open ends of the cylindrical and frusto-conical portions 604a, 604b have equal cross-sectional areas. The frusto-conical portion 604b also has a second open end opposite the first open end. This second open end serves as a liquid outlet 606 for liquid that has been separated from the liquid spray. The frusto-conical portion 604b tapers from the first open end towards the second open end.

Figure 7:
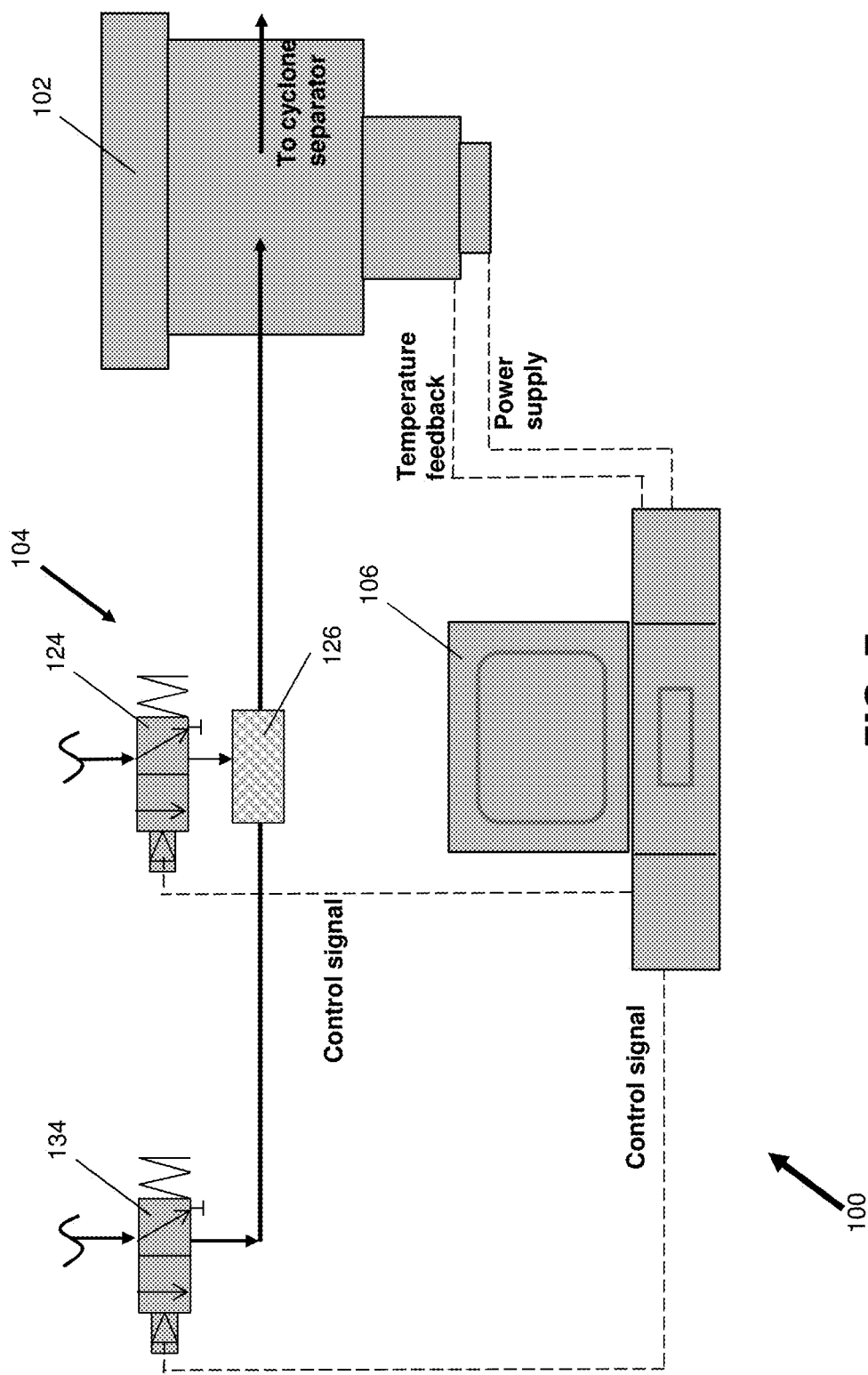

FIG. 7 shows the interaction of the heater control mechanism 106 with the atomization mechanism 104 and the bond head 102. For illustration purposes, only the liquid solenoid valve 124, gas solenoid valve 134 and atomization module 126 of the atomization mechanism 104 are shown in FIG. 7.

As shown in FIG. 7, the heater control mechanism 106 is configured to receive temperature feedback from the temperature sensors of the bond head 102, and is further configured to control a power supply to the heater plate 202 and the atomization mechanism 104 based on the temperature feedback. More specifically, the heater control mechanism 106 is operative to adjust the power supply to change the heating rate of the heater plate 202 depending on whether the heater plate 202 needs to be heated or cooled. The heater control mechanism 106 is also operative to initiate the formation of the liquid spray in the atomization mechanism 104 upon detecting a need to cool the heater plate 202 and to stop directing the liquid spray to the bond head 102 upon detecting a need to heat up the heater plate 202. The control of the atomization mechanism 104 by the heater control mechanism 106 is performed via control signals configured to activate and deactivate the liquid and gas solenoid valves 124, 134. The heater control mechanism 126 is also operative to adjust the operating parameters (for example, the operating time) of the liquid and gas solenoid valves 124, 134. Such adjustment allows control and variation of the flow rate of the liquid spray into the bond head 102 (which in turn affects the rate of cooling the heater plate 202). It also allows the adjustment of the relative proportions of the liquid and gas in the liquid spray.

In use, an electronic device attached with solder balls is picked up and held on the collet of the bond head 102. Next, the power supply to the heater plate 202 is turned on. As the heater plate 202 is being heated up, the heater control mechanism 106 sends control signals to the liquid solenoid valve 124 to activate it. The activation of the liquid solenoid valve 124 introduces liquid into the atomization module 126, specifically, into the mixing tube 502 via the liquid inlet 508. Note however that the gas solenoid valve 134 remains deactivated so that no liquid spray is directed to the bond head 102 at this time.

The heater plate 202 is heated up to a first target temperature of 350 degrees Celsius and is maintained at this first target temperature for a predetermined period of time. This melts the solder balls that are attached on the electronic device. While the solder balls are melted, the electronic device is urged against a bonding site on a substrate with a predetermined force, with the solder balls abutting the substrate. As a result, the electronic device is bonded to the substrate via the solder balls.

After a predetermined period of time, the heater plate 202 is cooled to a second target temperature and is maintained at this second target temperature before another electronic device is picked up and held on the collet of the bond head 102 (after which, the heater plate 202 is heated up to the first target temperature again). The cooling of the heater plate 202 cools the electronic device together with the substrate. This solidifies and hardens the solder ball joints between the substrate and the electronic device, strengthening the bond between them. Note that the second target temperature is above an evaporation temperature of the liquid to prevent liquid droplets from being left in the cooling portion 304 of the cooling channel in the bond head 102.

The heater plate 202 is heated up or cooled to, and maintained at a desired temperature (either the first or second target temperature) using the heater control mechanism 106. In particular, the temperature sensors of the bond head 102 sense the temperature of the heater plate 202 and provide temperature feedback to the heater control mechanism 106. If the temperature feedback indicates that the temperature of the heater plate 202 is above the desired temperature, the heater control mechanism 106 adjusts the power supply to reduce the heating rate of the heater plate 202 (or maintains the power supply at the same level if the heating rate is already at the lowest heating rate). The heater control mechanism also starts or continues a cooling process (as elaborated below) to cool the heater plate 202. If on the other hand, the temperature feedback indicates that the temperature of the heater plate 202 is at or below the desired temperature, the heater control mechanism 106 adjusts the power supply to increase the heating rate of the heater plate 202 (or maintains the power supply at the same level if the heating rate is already at the highest heating rate). If the cooling process is being carried out, the heater control mechanism 106 also stops this cooling process.

The cooling process is elaborated below.

At the start of the cooling process, the heater control mechanism 106 sends control signals to the gas solenoid valve 134 to activate it. The activation of the gas solenoid valve 134 introduces a high-speed flow of gas simultaneously into the mixing tube 502 of the atomization module 126 via the first compressed gas inlet 510, and the conveying tube 504 of the atomization module 126 via the second compressed gas inlet 512. This high-speed flow of gas blows the liquid previously introduced into the mixing tube 502.

Figure 5:
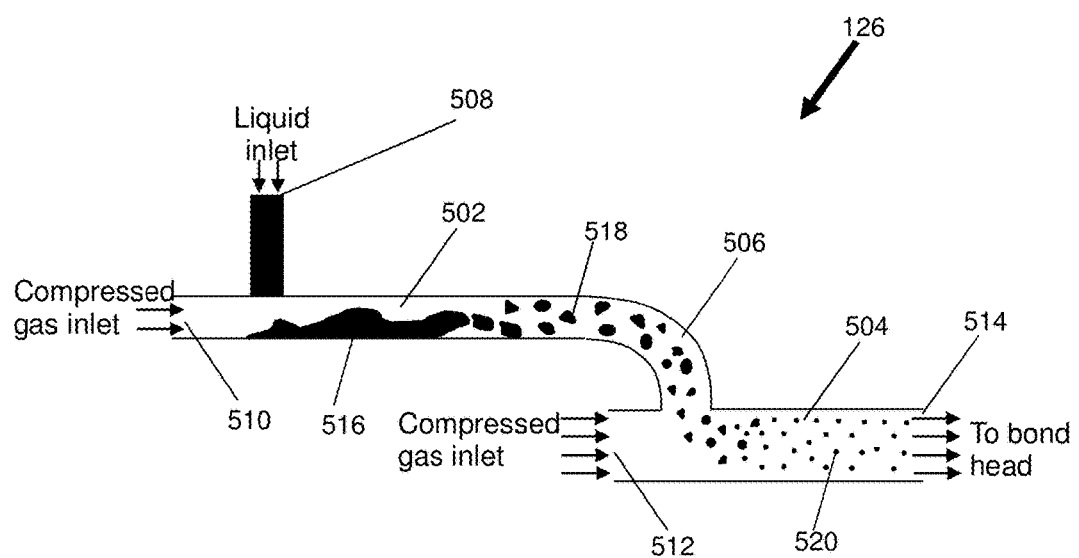

Initially, a wavy surface liquid film 516 (see FIG. 5) is formed. As the gas continues to flow into the mixing tube 502, a first gas tearing action caused by the high speed gas flow disintegrates the liquid film 516 into liquid droplets 518. The liquid droplets 518 then flow through the T-joint 506 into the conveying tube 504 of the atomization module 126. In the conveying tube 504, the liquid droplets 518 interact with the gas flow introduced via the second compressed gas inlet 512 to form the liquid spray 520. In particular, the continuous high-speed gas flow into the conveying tube 504 causes a second gas tearing action which converts the liquid droplets 518 into the liquid spray 520. The liquid spray 520 then flows out of the atomization module 126 via the liquid spray outlet 514 into the conduit. The conduit connected to the atomization module 126 then conveys the liquid spray from the atomization module 126 to the spray inlet 212 of the bond head 102.

The liquid spray enters the bond head 102 via the spray inlet 212. Inside the bond head 102, the liquid spray flows through the cooling channel to which the spray inlet 212 leads. In particular, the input portion 302 of the cooling channel directs the liquid spray from the spray inlet 212 to the inclined inlet 308. The inclined inlet 308 then directs the liquid spray to the cooling portion 304. The cooling portion 304 allows the liquid spray through it and since it is in contact with the bottom surface of the heater plate 202, heat is transferred from the heater plate 202 to the liquid spray. This cools the heater plate 202 and heats up the liquid spray. The inclined outlet 310 then directs the hot liquid spray exiting the cooling portion 304 to the output portion 306 which in turn directs the hot liquid spray to one of the exhaust outlets 214.

The hot liquid spray exits the bond head 102 via the exhaust outlet 214 and flows into the hot spray inlet 602 of the cyclone separator 114. This leads the hot liquid spray into the cylindrical portion 604a of the cyclone separator's hollow body 604. The cyclone separator 114 is arranged such that the hot liquid spray flows downwards through the cylindrical portion 604a and then through the frusto-conical portion 604b, cooling down as it flows. This causes the liquid spray to flow in a helical pattern in the frusto-conical portion 604b, forming a high speed rotating spray flow in this portion 604b. This in turn separates the liquid from the gas in the liquid spray. In particular, liquid in the rotating spray flow is unable to follow the flow path and thus, strikes the walls of the frusto-conical portion 604b and falls to the bottom of the frusto-conical portion 604b where the liquid outlet 606 is. The liquid then flows through the liquid outlet 606 and is collected at the liquid supply so that the liquid can be reused. The rest of the liquid spray comprises moisture gas which flows in a straight line from the frusto-conical portion 604b to the cylindrical portion 604a and out of the cyclone separator 114 via the moisture outlet 608.

To stop the cooling process, the heater control mechanism 106 sends control signals to the liquid and gas solenoid valves 124, 134 to deactivate these valves 124, 134. This prevents the liquid and gas from entering the atomization module 126, in turn stopping the formation of the liquid spray. As a result, flow of the liquid spray into the bond head 102 is stopped.

Various modifications will be apparent to those skilled in the art.

For example, the angle at which the inclined inlet 308 is inclined with respect to the cooling portion 304 need not be 30 degrees and may range from 30 to 60 degrees (inclusive of 30 and 60 degrees). Similarly, the angle at which the inclined outlet 310 is inclined with respect to the cooling portion 304 need not be 30 degrees and may also range from 30 to 60 degrees (inclusive of 30 and 60 degrees). Further, the inclined inlet 308 and the inclined outlet 310 may be inclined with respect to the cooling portion 304 at different angles.

Also, the conduit need not be in the form of a tube. The conduit may be in any other form as long as it can convey the liquid spray from the atomization module 126 to the spray inlet 212 of the bond head 102 at an acceptable rate.

In addition, instead of the $TiO_2$ layer 312, the cooling layer coating the bottom surface of the heater plate 202 may be in the form of a different hydrophilic layer such as a $SiO^2$ layer. Further, the liquid may be in the form of distilled water or any other cooling agent suitable for cooling the heater plate 202. Similarly, the gas may be in any form suitable for atomizing the liquid to form the liquid spray.

The number of spray inlets 212 and exhaust outlets 214 may also vary from those in the bond head 102. There may also be more than one cooling channel to further increase the cooling efficiency.

In addition, although in the embodiment described above, the liquid and gas are introduced into the atomization module 126 at different times to form the liquid spray (in particular, the liquid is introduced while the heater plate 202 is being heated up, whereas the gas is introduced only upon detecting a need to cool the heater plate 202), it is possible to introduce the liquid and gas simultaneously into the atomization module 126 upon detecting the need to cool the heater plate 202.

Further, to cool the heater plate 202, it is also not necessary to both adjust the power supply to the heater plate 202 and perform the cooling process. Instead, it may be sufficient to simply perform the cooling process.

The invention claimed is:

1. An atomization mechanism for cooling a bond head, the atomization mechanism comprising:
    an atomization module configured to receive gas and liquid from a gas supply and a liquid supply respectively to form an atomized spray;
    wherein the atomization module comprises:
        a mixing tube comprising a liquid inlet and a first gas inlet to provide liquid and gas for forming a liquid and gas mixture; and
        a conveying tube joined to the mixing tube and comprising a second gas inlet to provide gas for converting the liquid and gas mixture into the atomized spray; and
    a conduit configured to convey the atomized spray from the atomization module to a spray inlet located at the bond head to receive the atomized spray into the bond head.

2. The atomization mechanism according to claim 1, further comprising a liquid pressure regulator operative to adjust a pressure of the liquid supply to the atomization module.

3. The atomization mechanism according to claim 1, further comprising a gas pressure regulator operative to adjust a pressure of the gas supply to the atomization module.

4. The atomization mechanism according to claim 1, further comprising a gas measuring unit operative to measure one or both of a pressure and a flow rate of the gas supply to the atomization module.

5. The atomization mechanism according to claim 1, further comprising valves which are configured to be selectively activated to control a flow of the gas supply and a flow of the liquid supply into the atomization module.

6. A bonding apparatus comprising:
a bond head comprising:
- a holding element configured to hold an electronic device;
- a heater configured to heat the holding element; and
- a spray inlet located at the bond head and configured to receive an atomized spray into the bond head to cool the heater; and an atomization mechanism comprising:
- an atomization module configured to receive gas and liquid from a gas supply and a liquid supply respectively to form the atomized spray; and
- a conduit configured to convey the atomized spray from the atomization module to the spray inlet located at the bond head.

7. The bonding apparatus according to claim 6, further comprising a plurality of leakage sensors arranged to detect leakage of the liquid from one or both of the atomization mechanism and the bond head.

8. The bonding apparatus according to claim 6, further comprising a plurality of humidity sensors arranged to determine a relative humidity around the bond head.

9. The bonding apparatus according to claim 6, further comprising a separating mechanism configured to receive the atomized spray from the bond head, the separating mechanism being operative to separate the atomized spray into liquid and gas respectively.

10. The bonding apparatus according to claim 9, wherein the separating mechanism comprises a hollow body configured to cause the atomized spray to form a rotating spray flow.

11. The bonding apparatus according to claim 10, wherein the rotating spray flow rotates in a helical pattern.

12. The bonding apparatus according to claim 9, wherein the separating mechanism comprises a hollow body having a cylindrical portion coupled with a frusto-conical portion.

13. The bonding apparatus according to claim 6, wherein the bond head further comprises a cooling channel through which the spray inlet is conveyed, the cooling channel being connected to the spray inlet and having a cooling portion in contact with the heater along a surface of the heater.

14. The bonding apparatus according to claim 13, wherein the cooling channel further comprises an inclined inlet configured to direct the atomized spray into the cooling portion, the inclined inlet being inclined at an angle of between 30 to 60 degrees with respect to the cooling portion.

15. The bonding apparatus according to claim 13, wherein the cooling channel further comprises an inclined outlet configured to direct the atomized spray exiting the cooling portion, the inclined outlet being inclined at an angle of between 30 to 60 degrees with respect to the cooling portion.

16. The bonding apparatus according to claim 6, further comprising a heater control mechanism operative to control the atomization mechanism and a power supply to the heater based on a temperature of the heater.

17. The bonding apparatus according to claim 16, wherein the heater control mechanism is operative to initiate the formation of the atomized spray in the atomization module upon detecting a need to cool the heater.

18. The bonding apparatus according to claim 16, wherein the heater control mechanism is operative to adjust the power supply to change a heating rate of the heater based on the temperature of the heater.

* * * * *